United States Patent [19]
Ozawa

[11] Patent Number: 5,118,370
[45] Date of Patent: Jun. 2, 1992

[54] LSI CHIP AND METHOD OF PRODUCING SAME

[75] Inventor: Kazuhito Ozawa, Nara, Japan

[73] Assignee: Sharp Kabushiki Kaisha, Osaka, Japan

[21] Appl. No.: 673,241

[22] Filed: Mar. 18, 1991

Related U.S. Application Data

[63] Continuation of Ser. No. 580,358, Sep. 10, 1990, abandoned, which is a continuation of Ser. No. 418,747, Oct. 4, 1989, abandoned, which is a continuation of Ser. No. 118,754, Nov. 5, 1987, abandoned.

[30] Foreign Application Priority Data

Nov. 7, 1986 [JP] Japan .................. 61-265789

[51] Int. Cl.⁵ ............................................. B29C 65/08
[52] U.S. Cl. .................... 156/73.1; 29/840; 29/879; 156/73.3; 156/261; 156/295; 156/580.2; 228/1.1; 228/110; 437/9; 437/183
[58] Field of Search .............. 228/1.1, 110, 180.2; 29/840, 483, 879; 156/73.1, 73.3, 261, 273.9, 272.4, 295, 580.2; 264/23; 437/9, 183, 187; 428/620, 650, 654

[56] References Cited

U.S. PATENT DOCUMENTS

| | | |
|---|---|---|
| 3,330,026 | 7/1967 | Best et al. .................. 228/1.1 |
| 3,357,090 | 12/1967 | Tiffany ........................ 29/840 |
| 3,531,852 | 10/1970 | Slemmons et al. .......... 228/1.1 |
| 3,670,394 | 6/1972 | Daniels et al. ............... 228/1.1 |
| 3,709,775 | 1/1973 | James ........................ 156/272.4 |
| 3,713,944 | 1/1973 | Dennis et al. ............... 156/261 |
| 3,733,685 | 5/1973 | Kauppila .................... 228/110 |
| 3,923,584 | 12/1975 | Hojo et al. .................. 156/379 |
| 3,926,357 | 12/1975 | Matrisian .................... 228/110 |
| 4,463,059 | 7/1984 | Bhattacharya et al. ...... 357/71 R |
| 4,618,516 | 10/1986 | Sager ........................... 264/23 |
| 4,680,617 | 7/1987 | Ross ............................. 357/70 |
| 4,693,770 | 9/1987 | Hatada ......................... 29/840 |
| 4,744,850 | 5/1988 | Imano et al. ................. 156/297 |
| 4,749,120 | 6/1988 | Hatada ...................... 156/295 X |

FOREIGN PATENT DOCUMENTS

| | | | |
|---|---|---|---|
| 100989 | 6/1983 | Japan | .................. 228/110 |
| 58-175838 | 10/1983 | Japan | .................. 437/183 |
| 62-115748 | 5/1987 | Japan | .................. 437/183 |
| 62-152143 | 7/1987 | Japan | .................. 437/183 |

Primary Examiner—Michael G. Wityshyn
Attorney, Agent, or Firm—Morrison & Foerster

[57] ABSTRACT

An LSI chip has Al bumps transferred from an Al-containing foil and formed thereon by ultrasonic bonding. The LSI chip is thereafter mounted on a circuit board by an adhesive containing fine metallic particles dispersed or arranged uniformly, an insulative adhesive with high fluidity or ultrasonic bonding.

11 Claims, 5 Drawing Sheets

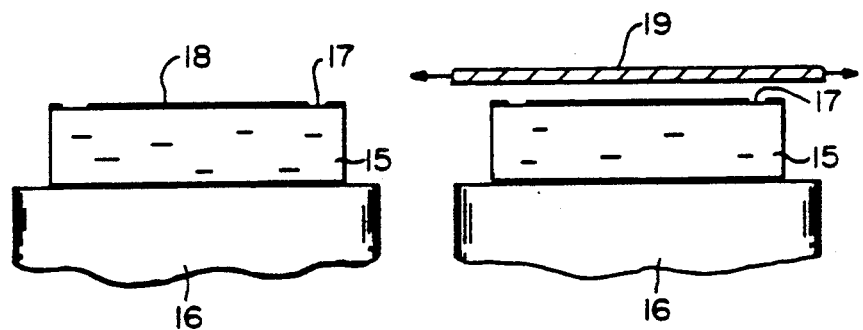
FIG.—1A  FIG.—1B
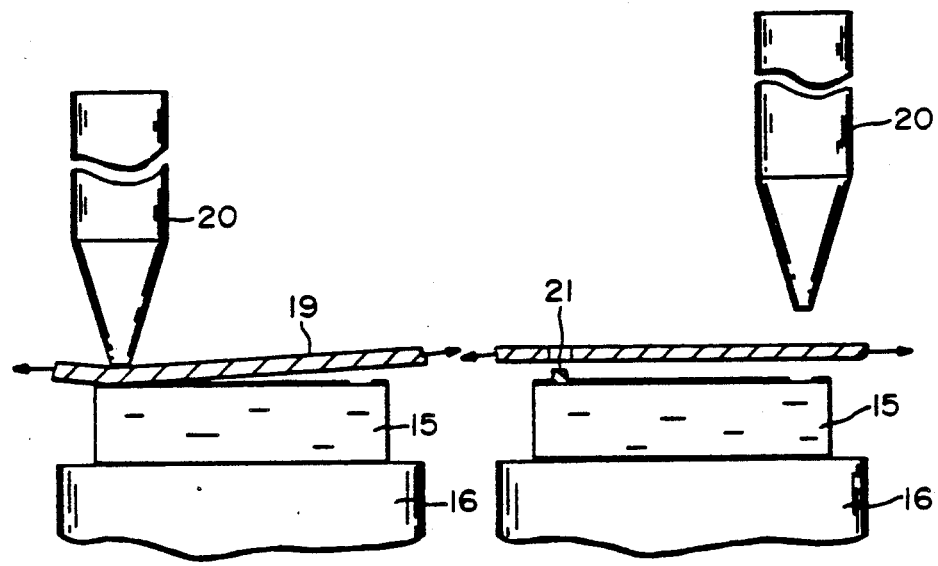
FIG.—1C  FIG.—1D
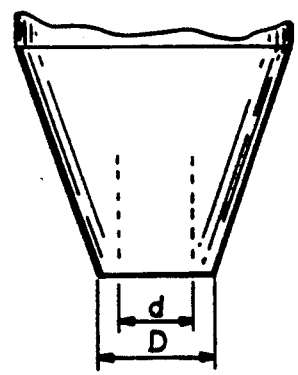
FIG.—2
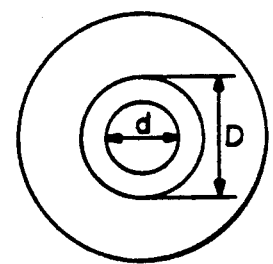
FIG.—3

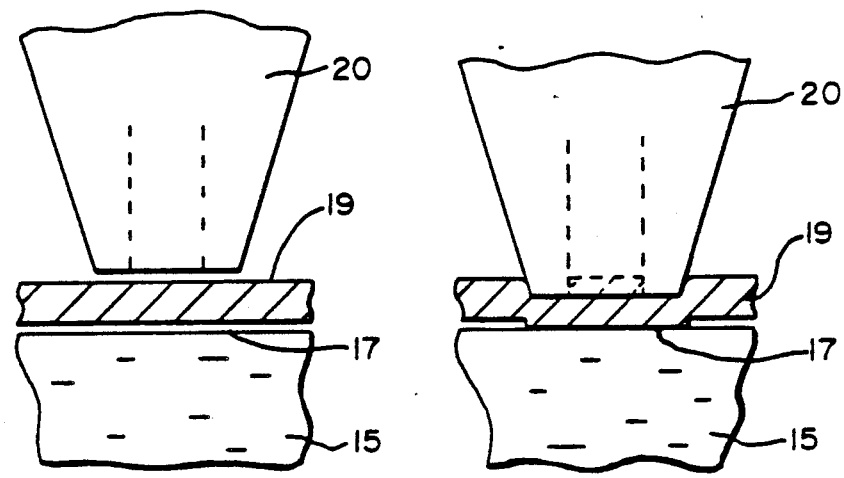
FIG.—4A  FIG.—4B
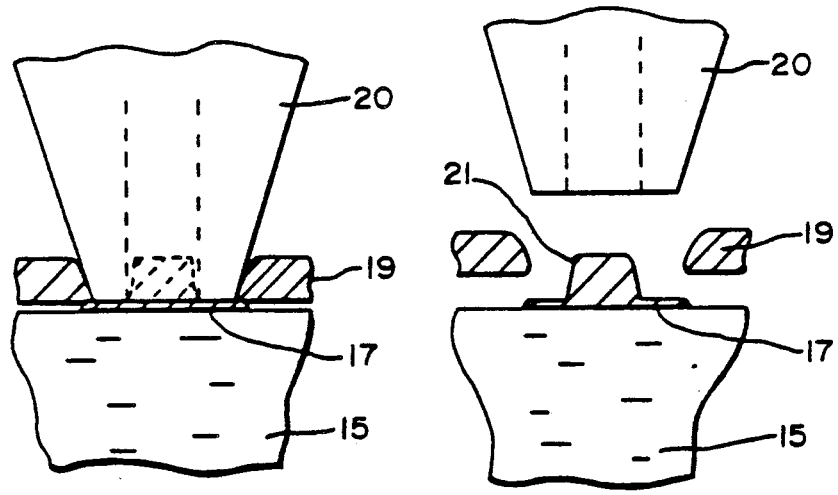
FIG.—4C  FIG.—4D

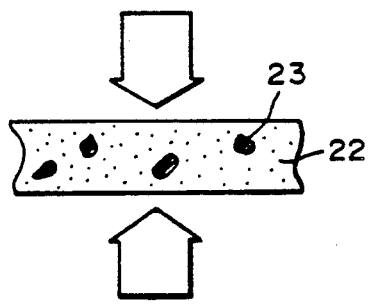
FIG.—5
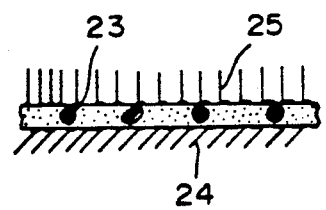
FIG.—6
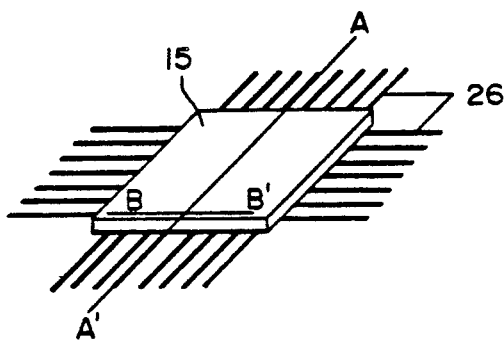
FIG.—7
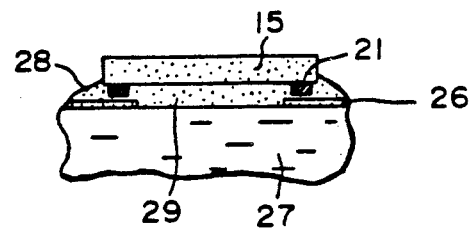
FIG.—8
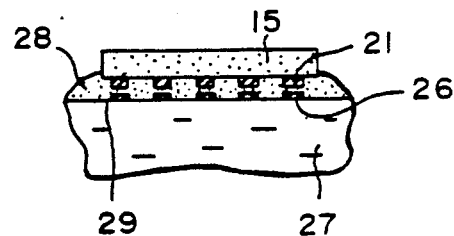
FIG.—9
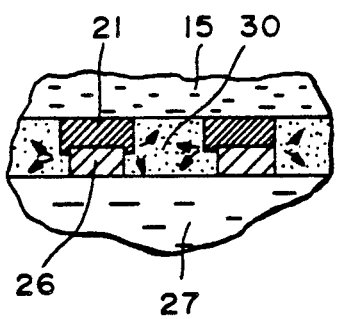
FIG.—10
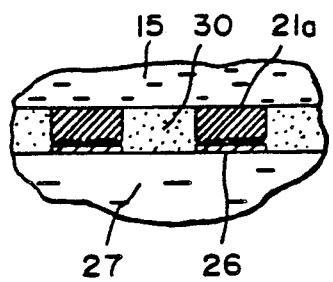
FIG.—11
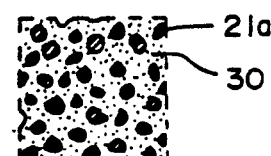
FIG.—12

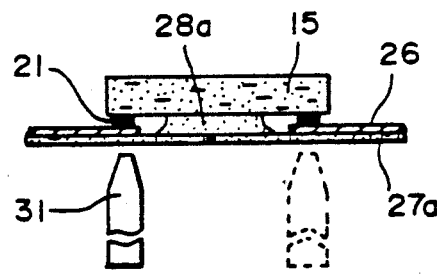
FIG.—13
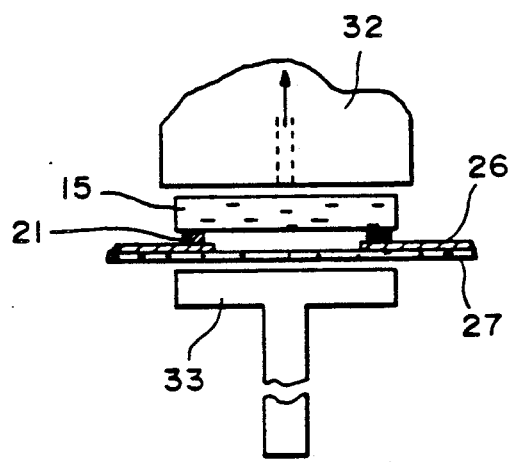
FIG.—14
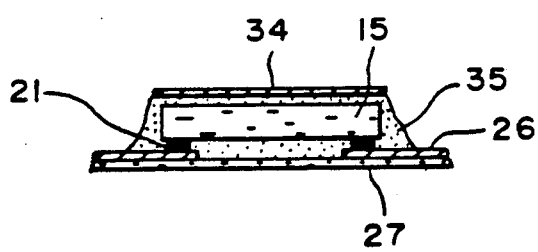
FIG.—15

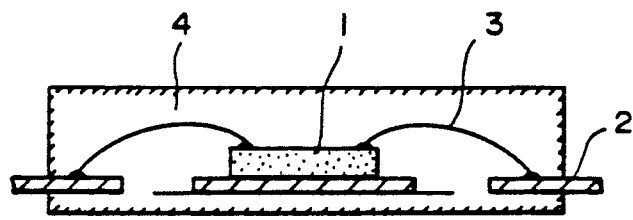
(PRIOR ART)
FIG.—16
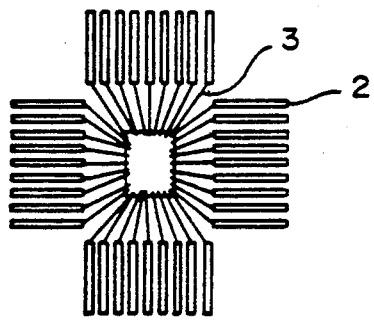
(PRIOR ART)
FIG.—17
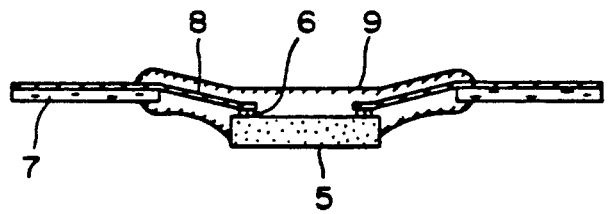
(PRIOR ART)
FIG.—18
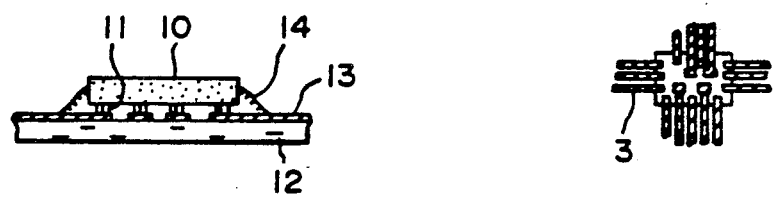
(PRIOR ART)
FIG.—19
(PRIOR ART)
FIG.—20

LSI CHIP AND METHOD OF PRODUCING SAME

CROSS-REFERENCE TO RELATED APPLICATIONS

This application is a continuation of U.S. Ser. No. 07/580,358, filed Sept. 10, 1990, now abandoned, which is a continuation of now abandoned U.S. Ser. No. 07/418,747, filed Oct. 4, 1989, now abandoned, which is a continuation of abandoned U.S. Ser. No. 07/118,754, filed Nov. 5, 1987, now abandoned, all of which applications are incorporated herein by reference and to which applications is claimed priority under 35 USC §120.

BACKGROUND OF THE INVENTION

This invention relates to a method of producing an LSI chip by which the process of forming bumps is significantly simplified and the cost of such a process can be reduced, and an LSI chip produced by such a method.

Conventional methods of forming an LSI chip on a substrate can be roughly divided into the following categories: wire bonding methods whereby the LSI chip is directly mounted on a substrate by wiring, and TAB (tape automated bonding) or flip chip bonding methods whereby the LSI chip is mounted on a substrate after a protrusions referred to as bumps are initially produced on the chip. These methods will be described below individually together with their characteristics and disadvantages.

(i) Wire Bonding Methods

By a wire bonding method, a gold wire, an aluminum wire or the like is used to mount the LSI chip. An example of LSI chip mounted on a lead frame is shown in FIG. 16 wherein numerals 1, 2, 3 and 4 indicate an LSI chip, a lead frame, a looping wire and a package, respectively. After the mounting, a plastic resin or ceramic material may be used for sealing and products thus obtained may be referred to as DIP (dual inline package), QFP (quarter flat package) or CC (chip carrier) and they are mounted on a substrate by soldering, etc. In other words, the LSI chip 1 is wire-bonded first to the lead frame 2 (inner bonding) and this lead frame 2 is then soldered (outer bonding) to a wiring substrate. This method is advantageous from the point of view of cost because there is no processing to be performed on the LSI chip. In the case of a multi-pin LSI chip, however, its external size becomes much greater than the size of the LSI chip itself because outer bonding must be performed and a large area is required for its mounting as illustrated in FIG. 17 wherein the same numerals as in FIG. 16 are used to indicate the same or equivalent components. In summary, the wire bonding methods are disadvantageous where high-density mounting is required. In order to eliminate this disadvantage, so-called COB (chip on board) methods are currently developed whereby the LSI chip is directly connected to the substrate by wiring but the thickness of Au
  solder on the board for wiring is required to be 2-3 μm, or 20-30 times as large as in the case of an ordinary board for soldering and this increases the cost of the board. As described above, furthermore, the wire 3 in a wire bonding method must be looped and this has the unfavorable consequence of increasing the thickness of the package considerably over that of the LSI chip 1 itself. Thus, this method is not suitable for thin products.

(ii) TAB Methods

With reference to FIG. 18 which shows an example of this method, numeral 5 indicates an LSI chip preliminarily provided with Au bumps 6 and when this LSI chip 5 is mounted, the bumps 6 are bonded to an Au-plated or Sn-plated lead wire 8 of a film carrier 7 having a polyimide or glass epoxy film as base. After the mounting, the device molded by a resin material 9 is inspected, separated from the film base and attached to a board by plating or conductive bonding (outer bonding). One of the advantageous characteristics of this method is that it can be used for effecting thin mounting. According to a recently developed method of using an anisotropic conductive adhesive for outer bonding, connections with a fine pitch not possible by a conventional soldering method can be achieved such that multi-pin LSI chips with as many as about loop pins can be formed effectively. This method is disadvantageous, however, in that Au bumps 6 must be formed first on the LSI chip 5 and that the photo-process as well as the vapor deposition, plating and etching processes must be repeated in the form of the wafer. Moreover, the cost of the LSI becomes high because of these processes. Although a method of transferring Au bumps to an LSI chip has recently been developed and this method is advantageous in that the LSI can be handled in the form of a chip, the transferred bumps themselves still require the photo-process and the vapor deposition, plating and etching processes and there is the extra process of transferring the bumps. In other words, this method is still disadvantageous because of the increased cost of transferred bumps and the increased number of processes.

(iii) Flip Chip Bonding Method

This method is frequently used as shown in FIGS. 19 and 20 when bumps 11 of a Pb-Sn alloy are first formed on an LSI chip 10 and it is mounted directly on a board. One of the characteristics of this method is that connection can be made to a wire 13 on the wiring board 12 directly below the LSI chip 10 since bumps 11 can be provided by effectively using the surface of the LSI chip 10 and that there is no need for Al wiring inside the LSI. Numeral 14 in FIG. 19 indicates a mold material. Accordingly, the action becomes faster and the device size can be reduced since there is no need to extend electrodes through the neighborhood of the LSI chip by this method unlike the wire bonding or TAB method. As in the TAB method, however, the process of forming the Pb-Sn bumps 11 by this method is complicated and the cost of LSI becomes high. Moreover, since the device is inspected only after the mounting is completed on the board, defects cannot be corrected in the mounted condition.

SUMMARY OF THE INVENTION

It is therefore an object of the present invention to provide an inexpensive method of producing LSI chips by a simplified process. The above and other objects of the present invention are achieved by forming bumps of an LSI chip from an Al-containing foil by using an ultrasonic head for bonding and transferring.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIGS. 1A–1D are drawings for showing a method of making an LSI chip embodying the present invention, FIG. 2 is a side view of the end section of the ultrasonic tool used in the method illustrated in FIGS. 1A–1D, FIG. 3 is an end view of the ultrasonic tool of FIG. 2, FIGS. 4A–4D are drawings for showing the formation of a bump on the chip of FIGS. 1A–1D, FIG. 5 is a schematic drawing of a layer of anisotropic conductive adhesive, FIG. 6 is a drawing for showing a method of mounting an LSI chip by using the adhesive of FIG. 5, FIG. 7 is a drawing for showing an example of mounted LSI chip, FIG. 8 is a sectional view taken along the line A—A of FIG. 7, FIG. 9 is a sectional view taken along the line B—B of FIG. 7, FIG. 10 is a drawing for showing another method of mounting an LSI chip, FIG. 11 is a drawing for showing still another method of mounting an LSI chip, FIG. 12 is a schematic enlarged view of the surface of a bump shown in FIG. 11, FIG. 13 is a drawing for showing a method of forming bumps on an LSI chip by ultrasonic bonding, FIG. 14 is a drawing for showing another method of forming bumps on an LSI chip by ultrasonic bonding, FIG. 15 is a drawing of a sealed package, and FIGS. 16 through 20 are schematic drawings of LSI chips produced by prior art methods.

DETAILED DESCRIPTION OF THE INVENTION

The present invention relates to an LSI chip produced by forming Al bumps on a bare LSI chip from an Al-containing foil by ultrasonic bonding and transferring. Methods of mounting on a board an LSI chip thus formed include using an adhesive with uniformly dispersed fine metallic particles, using an insulative adhesive and using an ultrasonic fabrication method of mounting on a PET flexible board with Al wiring. These methods will be explained below sequentially. First, however, a method of forming an Al bump on an Al electrode of an LSI chip will be explained.

FIGS. 1A–1D show a process of handling LSI in the form of a chip but it can be carried out similarly also in the form of a wafer. As shown in FIG. 1A, an LSI chip 15 is fastened on a flat stage 16, for example, by vacuum adsorption. The pattern of the fastened LSI chip is determined, for example, by using a marking and the LSI chip is positioned with respect to the origin (reference position) of an ultrasonic capillary tool (similar to the ultrasonic tool for a wire ball bonder, having a thin forward end and a hole at the center) and it is assumed that an Al electrode 17 and a protective film 18 are already formed on the top surface of the LSI chip 15.

Next, an Al foil 19 is placed at a certain appropriate distance above the top surface of the LSI chip as shown in FIG. 1B, and an ultrasonic capillary 20 is applied from above the Al foil 19 as shown in FIG. 1C, pressing the Al foil 19 against the top surface of the LSI chip 15. Since the position of the Al electrode 17 (pad location) of the LSI chip 15 with respect to the aforementioned origin is already inputted into and stored in this tool 20 as X and Y coordinates, the tool 20 can be automatically moved from one pad location to another sequentially for welding operations once the position of the LSI chip is determined in FIG. 1A. Whenever a welding operation is completed, the tool 20 is moved upward as shown in FIG. 1D. The Al foil 19 is in the form of a film and since a planar tension is applied thereon, the welded position and the base foil are automatically separated as the tool 20 is raised and a welded (transferred) Al protrusion remains on the Al electrode 17 of the LSI chip 15 as shown in FIG. 1D. The mechanism of forming a well-shaped Al protrusion 21 and separating it from the Al base foil 19 is explained next by way of FIG. 2 which generally shows the shape of the ultrasonic tool 20 and FIG. 3 which is a locally enlarged view of its end portion seen from the direction of its tip.

With an ordinary LSI chip, the Al electrode 17 is a square of size about 100 μm. In other words, the insulative protective film 18 on the top surface of the LSI chip 15 is square-shaped with sides of about 100 μm, exposing the Al electrode 17 therearound. The thickness of this insulative protective film is about 1 μm and the aforementioned Al electrode 17 is formed as an indentation. Accordingly, the tool 20 is so shaped that its outer diameter (D of FIG. 2) is about 80–90 μm and its inner diameter (d of FIG. 2) is about 30 μm. As will be explained below, this inner diameter is related to the height of the bump. Since these dimensions relate intimately to the durability of the tool 20, the pitch (interval) of the Al electrode 17, etc., they must be set according to the LSI chip 15 which is being used.

Next, the process of bonding the Al foil 19 onto the LSI chip 15 by using the tool 20 to form a bump is explained by way of FIGS. 4A–4D. Since the Al electrode 17 of the LSI chip 15 and the Al foil 19 are of the same material, the oxide films on their surfaces are easily broken if they are caused to rub against each other even for a short period of time at normal temperature by ultrasonic vibrations and they can easily bonded together. Moreover, since Al is relatively soft, they can be easily deformed by a small force and hence are very workable. Thus, this mechanical property of Al is utilized as shown in FIGS. 4A–4C to deform the Al foil 19 and the tool 20 is finally lifted from the Al foil 19 as shown in FIG. 4D.

Experiments have shown that if the Al foil 19 is thicker than the inner diameter d of the tool 20, the part of the foil which has been punched out tends to get stuck inside the tool 20 but this inconvenient phenomenon can be avoided by using an Al foil which is thinner than the inner diameter of the tool 20. In other words, the height of the produced Al bump 21 is determined by the thickness of the Al foil 19 and the measurements of the tool 20 are selected accordingly. If the thickness of the Al foil 19 is accurately controlled, the heights of the bumps can be controlled more uniformly than by soldering. Even if the heights of the bumps are not uniform when they are produced, such non-uniformity can be corrected at a later stage when the chip is mounted on a board because Al is a soft material.

The aforementioned method of forming Al bumps 21 on the Al electrode 17 of an LSI chip results in high electrical and chemical stability because connections are made between the same material and since use is made of ultrasonic waves, there is no problem of poor conductivity caused by oxide films on the Al surfaces. Moreover, damage to the chip 15 can be reduced because a soft material is used. The speed of processing can be as high as reachable by the ordinary wire bonding method. The rate of production is about 0.1 second per bump but this rate can be further improved in view of the recent progress in wire bonding technologies.

If the aforementioned series of processes is carried out in the form of a wafer, the speed of processing can be improved still further because the positions of all chips on a wafer are automatically determined as soon as the wafer position is determined. In this situation, the process of producing bumps is immediately followed by the step of cutting out LSI chips from the wafer. If the fabrication accuracy and durability of the tool 20 are improved, it may be possible to form Al bumps 21 by simultaneously transferring them onto a plurality of Al electrodes 17, thereby significantly improving the work efficiency.

Next, methods of mounting on a circuit board an LSI chip on which Al bumps 21 are formed by the aforementioned process are explained. Since the bumps 21 are made of Al according to the present invention, it is not necessary to rely on welding (such as ultrasonic bonding) or soldering methods but use may be made of adhesives for making connections. For example, an LSI chip may be mounted directly on a display means such as a liquid crystal cell by a COG (chip on glass) method or directly on an inexpensive film base by a COF (chip on film) method. In what follows, connection methods by using an adhesive will be explained first and other methods without using an adhesive will be described next.

(1) Connection method by using an adhesive in which fine metallic particles are uniformly dispersed or arranged Such an adhesive is usually referred to as an anisotropic conductive adhesive and its structure is illustrated in FIG. 5 where numeral 22 indicates a layer of adhesive with 15-30 μm in thickness having metallic particles dispersed therein. These particles 23 are about 3-8 μm in diameter and may comprise carbon or a metal such as nickel. If such an adhesive is inserted between objects 24 and 25 to be joined together and heat and pressure are applied, the adhesive flows out and the separation between the objects 24 and 25 becomes less than ½ of the initial thickness of the layer. The metallic particles 23 thereby become exposed partially to the mutually opposite surfaces of the objects 24 and 25 to establish an electrically conductive relationship therebetween. In this situation, these metallic particles 23 are mutually separated in the horizontal direction as shown in FIG. 6. Thus, objects can be joined together at a desired pattern pitch.

The adhesive of this type may be used in the form of a tape. Alternatively, it may be used to initially form an adhesive layer on one of the objects to be joined together either by a printing or coating method. The adhesive 22 may be either thermoplastic or thermosetting type. The metallic particles 23 may be initially arranged at regular intervals in the adhesive 22. In such a situation, the metallic particles 23 may be as large as the thickness of the layer of adhesive as long as they are mutually insulated.

FIG. 7 shows an LSI chip with Al bumps embodying the present invention mounted on a circuit board by using an anisotropic conductive adhesive of the structure described above. Numeral 15 again indicates an LSI chip. Numeral 26 indicates a circuit pattern formed on a board. In FIGS. 8 and 9 which are sectional views taken along the lines A—A' and B—B' of FIG. 7, respectively, numeral 27 indicates the board, numeral 28 indicates the adhesive, numeral 29 indicates the metallic particles and numeral 21 indicates an Al bump. As pressure is locally applied to the Al bumps 21, the adhesive flows out, corresponding to the volume of the bumps 21 and electrical connections are established with the board 27 through the metallic particles 29. Where there is no bump on the LSI chip, on the other hand, the adhesive 28 does not flow too much and such areas remain immersed in the adhesive 28 and hence electrically insulated. Thus, the edges around the LSI chip 15 and the central surface of the device are insulated from the circuit pattern 26 while the LSI chip 15 is protected against damage due to the metallic particles 29. Since metallic particles are frequently exposed at the boundary surface of an adhesive especially in an anisotropic conductive film of the type with regularly arranged metallic particles, the initial thickness of the anisotropic conductive film should preferably be made much smaller than the height of the Al bumps.

Since the Al bumps 21 formed on the LSI chip are soft, the metallic particles in the anisotropic conductive film can easily penetrate them, thereby breaking the insulative oxide layer on the bump surfaces to reduce resistance. Moreover, since these metallic particles can serve as anchors, they can remain in the bumps in spite of thermal distortions of the joined bodies, and variations in the adhesive force as well as dimensional distortions. Reliability of connections is therefore improved by this method.

By using this method, LSI chips can be mounted not only on a gold-plated copper circuit board conventionally used for soldering, but also on a circuit board which has conductive ink printed on and cannot be soldered, on a signal terminal of a liquid crystal display with an ITO thin film pattern on a glass substrate or even on a circuit board with wiring on a PET film having low resistance against heat of soldering.

(2) Method of connecting LSI chip to a circuit board by an insulative adhesive with high fluidity By this method, as shown in FIG. 10, the insulative adhesive 30 is caused to flow out by the heat and pressure with which the LSI chip 15 is connected to the circuit board 27 such that the Al bumps 21 of the LSI chip 15 are directly connected to the circuit pattern 26. This method utilizes the characteristic of the adhesive 30 to flow even under a relatively low pressure if its viscosity is lowered to increase its fluidity.

Since pressure becomes locally concentrated at places where the circuit pattern 26 and the Al bumps 21 are overlapped, the adhesive 30 tends to flow away from such places and the Al bumps 21 and the circuit pattern 26 come to touch each other, the LSI chip 15 and the circuit board 27 becoming fastened with respect to each other by the adhesive 30 thus flowing away. If a copper foil were used for the circuit pattern on the circuit board 27, there would usually be surface indentations and protrusions of about 2-3 μ but since the Al bumps 21 are soft, those protrusions in the pattern penetrate the Al bumps 21 when they are pressed against them, thereby forming stable connections therewith.

Alternatively, the surface of the Al foil to be transferred may be preliminarily made rough (mat processing) such that the surfaces of the Al bumps after transferring can be made rough as shown in FIG. 11 where numerals 15, 26, 27 and 30 are as defined above. Numeral 21a indicates one of the Al bumps of which an enlarged sectional view of an end surface is shown in FIG. 12. If the circuit pattern 26 is vapor-deposited ITO on a glass substrate such as an LCD, protrusions from the surface of the Al bump 21a touch the ITO part of the opposite member while the adhesive 30 is left in the neighboring indentations such that the terminals can be securely connected together.

One of the characteristics of this method is that even very fine patterns can be reliably insulated because there are no conductive metallic particles and hence that there is no problem of so-called crosstalks. Moreover, there is no problem of metallic particles getting stuck to the LSI chip 15 due to variations in their sizes and thereby destroying the LSI chip 15. If a glass substrate with an ITO film pattern which is transparent and conductive is used as the board 27, the back surface of the glass substrate may be exposed to an ultraviolet or an electron beam to make use of the hardened substance which becomes attached thereon.

(3) Method of connecting Al bumps of an LSI chip and the Al wiring of a circuit pattern by ultrasonic bonding when a flexible substrate with Al wiring on a PET film is used as circuit board.

This method of connection is based on the same principle as the method of transferring Al bumps on an LSI chip. After the LSI chip 15 and a flexible (PET) board 27a are securely positioned, parts of the LSI chip 15 corresponding to Al bumps 21 are pressed by ultrasonic waves from the back surface of the board 27a, causing friction between the Al wiring pattern 26 and the Al bumps 21 to bond them together. FIG. 13 shows a process of securing the LSI chip 15 on the flexible board 27a by means of an adhesive 28a and using a slender tool 31 for ultrasonic bonding to press the Al bumps 21 one at a time. FIG. 14 shows another process whereby no adhesive is used but the LSI chip 15 is secured by using an adsorptive table 32 and a planar ultrasonic tool 33 is used for bonding all bumps at once. In this situation, a molding resin material is frequently used after the ISI chip 15 is mounted to seal it for reinforcement or for using it as a package. FIG. 15 shows an example of package thus formed with a disc 34 which is frequently used for controlling the height of the mold 35 and the boundary of the seal.

The foregoing description of a preferred embodiment of the invention has been presented for purposes of illustration and description. It is not intended to be exhaustive or to limit the invention to the precise form disclosed, and many modifications and variations are possible in light of the above teaching. For example, the present invention is applicable when use is made of a foil of an Al alloy instead of an Al foil to form Al bumps by ultrasonic bonding and transferring.

In summary, LSI chips according to the present invention do not require a photo-process, nor vapor deposition, etching or plating process for making bumps. This means that apparatus for use in these processes can be dispensed with. Since they can be produced with simple bonding equipment such as a wire bonder or a die bonder, the production can be simplified and the cost of equipment can be significantly reduced. Moreover, since ultrasonic bonding is used for connecting Al bumps to the Al electrode of an LSI, the insulative oxide surface layers can be broken easily and since the connection is between metallic bodies of the same kind, there is no need for any additional thin film for ensuring connection. Furthermore, there is no problem of mutual diffusion between the Al electrode of an LSI and the bump metal which would require consideration if Au bumps or Pb-Sn bumps were used. In other words, problems associated with bumps of a conventional type such as changes with time and degradation of connection characteristics need no be considered. Thus, highly reliable low-resistance bump connections can be provided according to the present invention. If an adhesive is used for the mounting of the LSI after bumps are connected, a very inexpensive circuit such as a PET film board with.Al wiring, which could not be used before, can be made available. Additional advantages of the present invention are due to the softness of Al. Since Al is soft, bumps can be produced easily and the damage to the LSI at the time of their production can be reduced. When the LSI chip is mounted on a board after bumps are connected, these Al bumps serve as buffers, further reducing the damage to the LSI and improving workability.

In short, the present invention serves to simplify the process of producing bumps, to reduce the cost of production equipment, to improve the product quality and to increase the yield. Furthermore, since the the production can be effected either in the form of a chip or a wafer, the user may decide to purchase LSI chips and then mount them. In other words, the user can handle them as efficiently as packaged LSI of all kinds. High-density and thin-type mounting can be effected as by the TAB and flip-flop methods and hence the present invention can be applied to the production of multi-pin LSI chips as well as to the multi-chip mounting wherein a plurality of LSI chips are handled simultaneously.

What is claimed is:

1. A method of forming an LSI chip, comprising:
   providing a flat stage having positioned thereon a base LSI chip, which base LSI chip has a protective film thereon, which film includes openings positioned over aluminum electrodes on the base LSI chip;
   positioning an aluminum foil over the protective film;
   positioning an ultrasonic capillary tool over the foil at a position above the protective film openings and electrodes wherein the ultrasonic capillary tool includes a ring-shaped contacting surface and further wherein the thickness of the aluminum foil is less than the inner diameter of the ring-shaped contacting surface of the capillary tool;
   applying ultrasonic vibrations with the ultrasonic capillary tool in order to bond the aluminum foil to the aluminum electrodes and form a bump on a surface of the aluminum foil, the height of the bump being controlled by the thickness of the aluminum foil.

2. The method as claimed in claim 1, wherein the protective film has a thickness of about 1 $\mu$m.

3. The method as claimed in claim 1, wherein the aluminum foil is positioned over the protective film while applying planar tension to the foil.

4. The method as claimed in claim 1, wherein the aluminum electrodes are square in shape and have a size of about 100 $\mu$m.

5. The method as claimed in claim 1, wherein the ring-shaped contacting surface has an outer diameter of about 80-90 %82 m and an inner diameter of about 30 $\mu$m.

6. The method as claimed in claim 1, wherein the steps of positioning the ultrasonic capillary tool and applying ultrasonic vibrations to form a bump are repeated a plurality of times in order to form a plurality of bumps on the surface of the aluminum foil.

7. The method as claimed in claim 6, wherein the ring-shaped contacting surface has an outer diameter of about 80–90 $\mu$m and an inner diameter of about 30 $\mu$m.

8. The method as claimed in claim 6, further comprising:
   applying an anisotropic conductive adhesive to the aluminum foil having bumps thereon; and
   bonding a circuit board to the adhesive.

9. The method as claimed in claim 8, wherein the adhesive is applied in a layer having a thickness of about 15–30 $\mu$m.

10. The method as claimed in claim 9, wherein the anisotropic conductive adhesive material is comprised of adhesive and metallic particles having a diameter of about 3–8 $\mu$m.

11. The method as claimed in claim 10, wherein pressure is applied to the circuit board in order to force the circuit board toward the aluminum bumps with sufficient forces so as to decrease the distance between the circuit board and the LSI chip to one-half or less of its initial distance to thereby squeeze out adhesive.

* * * * *